United States Patent
Osawa et al.

(10) Patent No.: US 10,421,662 B2
(45) Date of Patent: Sep. 24, 2019

(54) SENSOR FIXING STRUCTURE INCLUDING VALVE BODY AND PRESSURE SENSOR

(71) Applicant: Nidec Tosok Corporation, Zama-shi, Kanagawa (JP)

(72) Inventors: Tomoka Osawa, Zama (JP); Hironobu Wakabayashi, Zama (JP); Toshiaki Nakamura, Zama (JP); Hiroshi Tatsuta, Zama (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 134 days.

(21) Appl. No.: 15/681,456

(22) Filed: Aug. 21, 2017

(65) Prior Publication Data

US 2018/0057355 A1 Mar. 1, 2018

(30) Foreign Application Priority Data

Aug. 23, 2016 (JP) .................................. 2016-162766

(51) Int. Cl.
*G01L 7/18* (2006.01)
*B81B 7/00* (2006.01)
*F16H 61/00* (2006.01)
*G01L 19/00* (2006.01)
*G01L 19/14* (2006.01)

(52) U.S. Cl.
CPC ....... *B81B 7/0051* (2013.01); *F16H 61/0009* (2013.01); *G01L 7/18* (2013.01); *G01L 19/003* (2013.01); *G01L 19/143* (2013.01); *B81B 2201/0264* (2013.01)

(58) Field of Classification Search
USPC ..................................................... 73/700–756
See application file for complete search history.

(56) References Cited

U.S. PATENT DOCUMENTS

| 5,853,020 A | * | 12/1998 | Widner | ................ | B60C 23/004 137/227 |
| 2008/0132381 A1 | * | 6/2008 | Seid | ........................ | F16H 59/72 477/98 |
| 2010/0186830 A1 | | 7/2010 | Shigyo et al. | | |
| 2015/0137281 A1 | | 5/2015 | Imai et al. | | |
| 2018/0023469 A1 | * | 1/2018 | Osawa | .................. | F01M 11/00 180/441 |
| 2018/0038770 A1 | * | 2/2018 | Osawa | .................. | G01M 13/02 |
| 2018/0087990 A1 | * | 3/2018 | Osawa | .................. | G01L 19/143 |
| 2018/0143093 A1 | * | 5/2018 | Osawa | .................. | G01L 19/003 |

FOREIGN PATENT DOCUMENTS

| JP | 2010-174991 A | 8/2010 |
| JP | 2015-096843 A | 5/2015 |

\* cited by examiner

*Primary Examiner* — Andre J Allen
(74) *Attorney, Agent, or Firm* — Keating & Bennett, LLP

(57) ABSTRACT

A groove is provided at an outer side of an outer wall of a pressure sensor in a radial direction, and opens at one end side in an axial direction of the pressure sensor. A horizontally extending stopper is provided at an inner wall of a sensor accommodation recessed portion. A fixing portion is provided on the outer side of the outer wall of the pressure sensor in the radial direction, and enters the stopper. The fixing portion protrudes outward in the radial direction from the outer wall of the pressure sensor accommodated in the accommodation recessed portion, and contacts the stopper in the axial direction.

10 Claims, 5 Drawing Sheets

SENSOR FIXING STRUCTURE INCLUDING VALVE BODY AND PRESSURE SENSOR

CROSS REFERENCE TO RELATED APPLICATIONS

This application claims the benefit of priority to Japanese Patent Application No. 2016-162766 filed on Aug. 23, 2016. The entire contents of this application are hereby incorporated herein by reference.

BACKGROUND OF THE INVENTION

1. Field of the Invention

The present invention relates to a pressure sensor attachment structure that is suitable for use in, for example, a control valve of an automobile transmission.

2. Description of the Related Art

Automatic transmissions of vehicles include a control valve for controlling a transmission mechanism. The control valve controls the transmission mechanism by supplying or stopping the supplying of a predetermined oil pressure to the transmission mechanism by using a solenoid valve. Some known existing control valves include a valve body including an upper body and a lower body that are superimposed upon each other. An oil passage, in which hydraulic oil flows, is formed in the valve body. A solenoid valve for switching oil pressure and a sensor for detecting oil pressure in the oil passage are disposed in the valve body.

In most existing control valves, electronic devices, such as a sensor, are independently attached to the valve body. Since there is a demand for size reduction in recent years, formation of control valves with a built-in structure, in which an electronic component is interposed between an upper body and a lower body, is being considered. However, in a built-in-type attachment structure, it is necessary to, for example, insert the sensor into the upper body from a lower surface to an upper surface of the upper body and, while temporarily taking measures that prevent the sensor from falling out from the upper body, assemble the sensor to the lower body. Therefore, problems, such as the mounting being troublesome, occur.

As existing technologies for attaching a sensor from above a valve body, Japanese Unexamined Patent Application Publication No. 2010-174991 describes a known technology in which an internally threaded portion is formed at an outer surface of the valve body, and a male screw that is provided on an outer periphery of the sensor is fitted into the internally threaded portion.

Japanese Unexamined Patent Application Publication No. 2015-96843 describes a known technology in which a recessed portion is formed in the valve body, and an outer periphery of the sensor that has been fitted into the recessed portion is fixed by a protrusion provided at the valve body.

Regarding the attachment structure in Japanese Unexamined Patent Application Publication No. 2010-174991, it is troublesome to form the internally threaded portion at the valve body, and thread engagement dimension is required, as a result of which the size of the attachment structure is inevitably increased.

In addition, the screw needs to be tightened with a certain torque, time is required to tighten the screw, and oil leakage may occur if the screw is not tightened with a proper torque.

Regarding the attachment structure in Japanese Unexamined Patent Application Publication No. 2015-96843, the sensor can be fixed to the valve body by the simple operation of only crimping the protrusion. However, since the valve body has the protrusion, when the protrusion breaks during transport or storage or when attaching the sensor, it becomes impossible to fix the pressure sensor to this portion. Therefore, the valve body, itself, which is much more expensive than the sensor becomes unusable. Since the sensor is fixed to the valve body such that the plastically deformed protrusion covers the periphery of the sensor, when a high pressure is repeatedly applied to the sensor, the crimping strength at the plastically deformed portion may be reduced. In order to solve such problems, making the protrusion strong by a rigid surface may be considered. However, in this case, crimping workability itself may be reduced. The use of a special material for the valve body whose strength reduction is small when the protrusion is plastically deformed may also be considered. However, such a special material cannot be used in the valve body that is made of a currently used material.

For the latter attachment structure, when oil pressure is applied to the sensor that is fixed to the valve body with respect to the crimped protrusion, the oil pressure is received by the crimped protrusion. Since the direction in which the protrusion receives stress is in a direction in which the strength with which the sensor is held down is reduced, the strength with which the sensor and the valve body are fixed to each other may be reduced due to long use.

Accordingly, it is an object of the present invention to provide a sensor attachment structure which allows a sensor to be easily fixed to a valve body by a crimping operation and that allows the sensor to be replaced without breaking the valve body.

SUMMARY OF THE INVENTION

A sensor attachment structure according to the present invention has the following structure and includes:
 (1) a valve body that has an oil passage therein, the valve body including an open end portion of the oil passage and an accommodation recessed portion in a surface of the valve body, the accommodation recessed portion being connected to the open end portion of the oil passage;
 (2) a pressure sensor whose external shape is a columnar shape, the pressure sensor being connected to the oil passage with at least a portion of the pressure sensor being disposed in the accommodation recessed portion;
 (3) a groove that is provided at an outer side of an outer wall of the pressure sensor in a radial direction, the groove being open at one end side in an axial direction of the pressure sensor;
 (4) a horizontally extending stopper that has a form of a groove and that is provided at an inner wall of the sensor accommodation recessed portion; and
 (5) a fixing portion that is provided on the outer side of the outer wall of the pressure sensor in the radial direction with respect to the groove, and that enters the stopper,
 (6) wherein the fixing portion protrudes outward in the radial direction from the outer wall of the pressure sensor accommodated in the accommodation recessed portion and that contacts the stopper in the axial direction.

In the present invention, it is desirable that the sensor attachment structure have the following structural features:
 (1) The fixing portion is a crimped portion.

(2) The crimped portion is connected to the outer wall of the pressure sensor at a second end thereof in the axial direction, and protrudes outward in the radial direction and contacts the stopper at a first end thereof in the axial direction.

(3) The stopper is provided along an entire periphery of a wall at the accommodation recessed portion.

(4) An end portion of the crimped portion at the one end side in the axial direction has an arc shape.

(5) The stopper in the form of the groove has an inclined portion at an edge at the other end side in the axial direction, and the crimped portion contacts the inclined portion.

(6) The surface of the valve body has a ring-shaped wall that protrudes towards the one end side in the axial direction of the pressure sensor, and a portion that is surrounded by the ring-shaped wall is the accommodation recessed portion.

(7) The surface of the valve body has a recessed portion whose bottom surface is recessed towards the other end side in the axial direction of the pressure sensor with respect to the surface of the valve body, and the recessed portion is the accommodation recessed portion.

(8) The valve body includes an upper body that includes the accommodation recessed portion and the oil passage, a lower body that is directly superimposed upon the upper body or that is superimposed upon the upper body with a separate plate in between, and an oil passage that is provided in the lower body and that is connected to the oil passage of the upper body. The accommodation recessed portion is provided in an upper surface of the upper body.

(9) The sensor includes a lower case that has an oil inlet space that is connected to the oil passage of the valve body, and an upper case that is attached to the lower case and that accommodates a pressure detection element. The lower case protrudes in a form of a flange outward in the radial direction with respect to the upper case, and includes the crimped portion at an outer side of a side wall of the lower case in the axial direction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
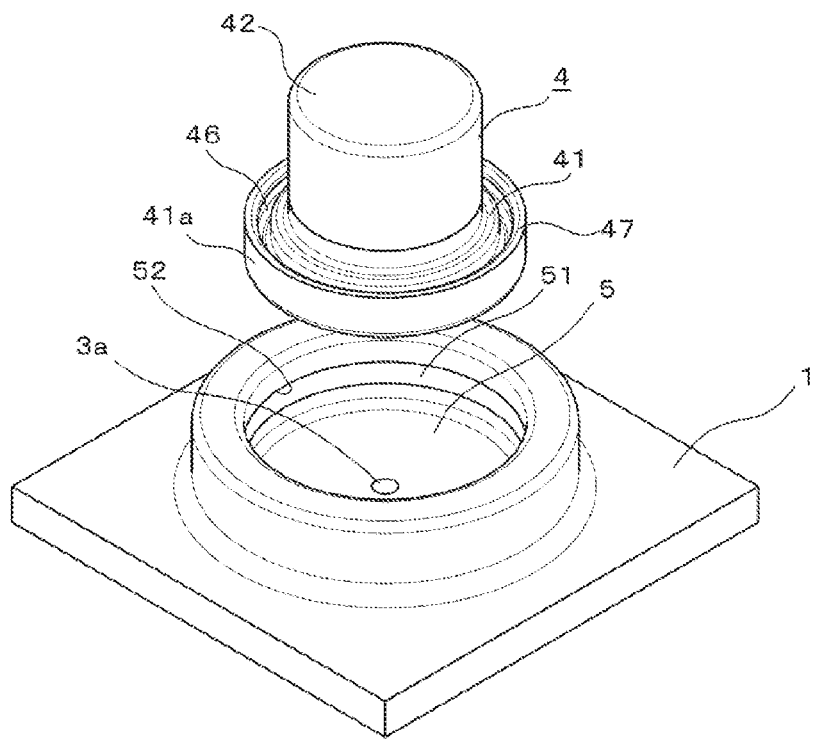
FIG. 1 is an exploded perspective view of a first embodiment.
Figure 2:
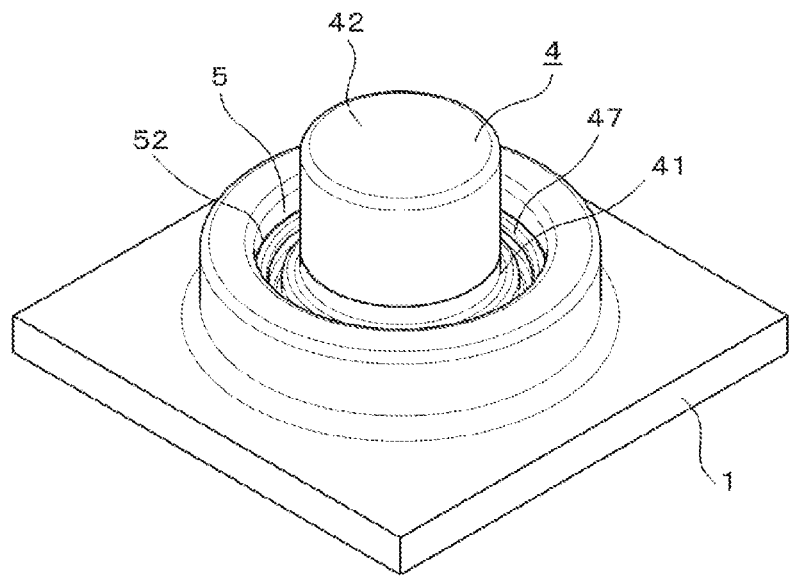
FIG. 2 is a perspective view illustrating an assembled state in the first embodiment.
Figure 3:
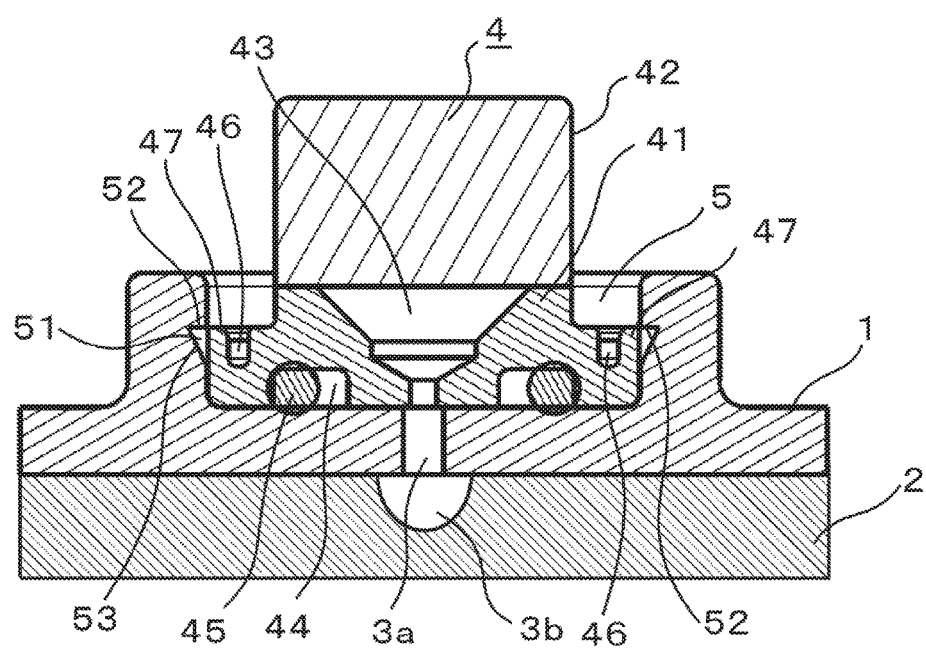
FIG. 3 is a vertical sectional view of the first embodiment.

Hereinafter, embodiments of the present invention are described. In each embodiment, the term "up-down direction" refers to a stacking direction in which an upper body and a lower body are stacked, the term "horizontal direction" refers to a direction along a plane orthogonal to the stacking direction, and the term "axis" refers to a central axis of a columnar pressure sensor along the up-down direction. The terms "inner side (inward)" and "outer side (outward)" refer to directions as viewed from the central axis of the pressure sensor. Unless otherwise noted, the term "circumferential direction" refers to a circumferential direction around the central axis; and the term "axial direction" refers to an axial direction in which the central axis extends.

1. First Embodiment

A first embodiment according to the present invention is described with reference to FIGS. 1 to 4B.

A valve body includes an upper body 1 and a lower body 2 that are stacked in the up-down direction. The upper body 1 has an oil passage 3a therein, and the lower body 2 has an oil passage 3b therein.

A lower open end of the oil passage 3a of the upper body 1 is connected to the oil passage 3b of the lower body 2, and an upper open end of the oil passage 3a of the upper body 1 opens at an upper surface of the upper body 1. The upper surface of the upper body 1 has an accommodation recessed portion 5 for accommodating a pressure sensor 4 in accordance with the position of the upper open end of the oil passage 3a.

In the embodiment, the external shape of the pressure sensor 4 is a circular columnar shape. The accommodation recessed portion 5 is formed by a ring-shaped wall that protrudes upward from a surface of the upper body 1 so as to surround the open ends of the oil passage 3a. The circular columnar pressure sensor 4 is fixed to an inner portion of the accommodation recessed portion 5 surrounded by the ring-shaped wall. A casing of the pressure sensor 4 is inserted into the accommodation recessed portion 5 from an upper side to a lower side along the central axis of the pressure sensor 4. The inside diameter of the accommodation recessed portion 5 is set so as to allow an outer peripheral surface of a lower case 41 of the pressure sensor 4, that is, a flange 41a of the lower case 41 to be tightly removably fitted to the accommodation recessed portion 5.

A groove 51 that is triangular in cross section and that is recessed outward with the axis of the pressure sensor 4 as a center is provided along the entire periphery of an inner wall of the accommodation recessed portion 5. The groove 51 has a horizontally extending stepped portion at its upper edge. The stepped portion corresponds to a stopper 52 that contacts a fixing portion 47 of the pressure sensor 4. A portion of the groove 51 that is below the stopper 52 is an inclined portion 53 that gradually becomes shallower towards a surface of the inner wall of the accommodation recessed portion 5 from a bottom of the groove 51. The fixing portion 47 of the pressure sensor 4 in a crimped state enters a triangular space that is surrounded by the stopper 52 and the inclined portion 53.

The pressure sensor 4 is a columnar member including the central axis extending in the up-down direction. The pressure sensor 4 includes the lower case 41 and an upper case 42 that is fixed to an upper side of the lower case 41. The lower case 41 and the upper case 42 correspond to the sensor casing according to the present invention. An outer periphery of the lower case 41 protrudes in the form of a flange outward in the circumferential direction with respect to an outer periphery of the upper case 42, that is, in a lateral direction in the figures; and is the flange portion 41a. The lower case 41 is capable of undergoing plastic deformation and is made of a metal having high strength. The upper case 42 is made of a resin.

The lower case 41 has an oil inlet space 43. One end side of the oil inlet space 43 opens to the oil passage 3a of the upper body 1. The other end side of the oil inlet space 43 is covered by a flexible plate that is deformable in accordance with oil pressure. A groove 44 that is recessed upward from a lower surface of the lower case 41 is provided in the lower case 41 on the outer side of the oil passages 3 in the circumferential direction. A sealing member 45, such as an O-ring, is fitted into the groove 44. The sealing member 45 hermetically seals a contact surface between the lower case 41 and the upper body 1.

A flexible plate (not shown) is provided between the lower case 41 and the upper case 42. A pressure detection element (not shown) is provided in the upper case 42 with the flexible plate in between. When the flexible plate is deformed due to oil pressure from the oil passage 3a, the pressure detection element detects this strain and the oil pressure in the oil passage 3a.

Figure 4A:
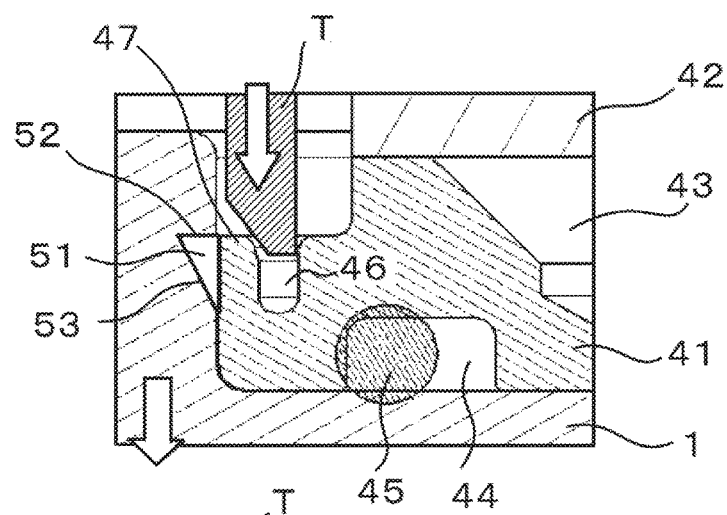
FIGS. 4A and 4B are each an enlarged vertical sectional view illustrating an assembling method according to the first embodiment.
Figure 4B:
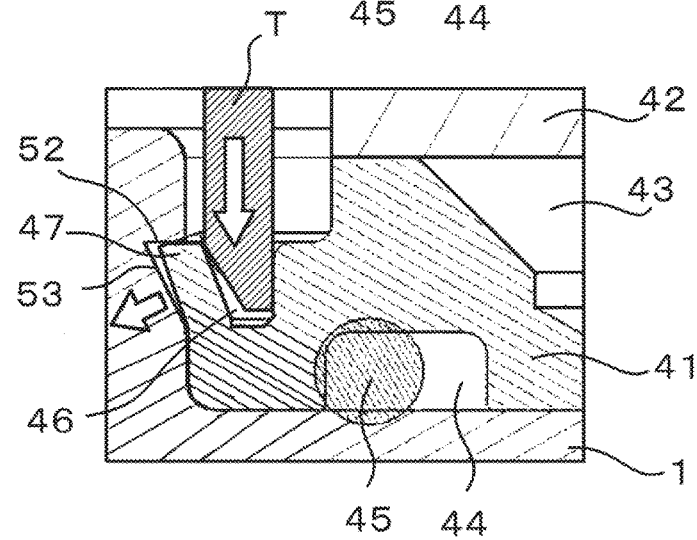

An outer wall of the pressure sensor 4, that is, in the embodiment, an upper surface of the flange portion 41a has a groove 46 that opens at an upper side thereof. The groove 46 has a ring shape along the entire periphery of the pressure sensor 4, and has a width that allows an end of a crimping jig to be inserted therein. The enlarged sectional views of FIGS. 4A and 4B show that edges of the open portion of the groove 46 are chamfered into an arc shape so as to allow the end of the jig to be smoothly inserted therein. A wall on the outer side of the groove 46 in a radial direction is the fixing portion 47 that protrudes upward from the outer wall of the pressure sensor 4, with an upper end of this protruding portion contacting the stopper 52 at the accommodation recessed portion 5.

An operation according to the first embodiment having a structure such as that described above is as follows.

In order to attach the pressure sensor 4 to the upper body 1, the pressure sensor 4 is inserted into the accommodation recessed portion 5 in the upper surface of the upper body 1 such that its flange portion 41a is fitted therein. As shown in FIG. 4A, with the lower case 41 in close contact with a bottom of the accommodation recessed portion 5, an end of a slotted-screwdriver-type jig T is inserted into the groove 46 in the flange portion 41a from thereabove, and a wall defining the groove 46 is pushed outward to crimp an end of the fixing portion 47 outward.

When this is done, the fixing portion 47 enters the groove 51 provided in the inner wall of the accommodation recessed portion 5, and comes into contact with the stopper 52 that is provided at an upper portion of the groove 51. At this time, since the fixing portion 47 is deformed outward while an end thereof moves along an arc-shaped path with a lower portion of the fixing portion 47 as a center, the end of the fixing portion 47 is strongly pushed against a lower surface of the stopper 52 having the stepped portion. Therefore, the fixing portion 47 moves to a location under the lower surface of the stopper 52 and as a result is strongly pushed by the stopper 52 from thereabove. Consequently, with a lower surface of the pressure sensor 4 being fixed while in close contact with a bottom portion of the accommodation recessed portion 5, oil tightness is provided between the oil passage 3a of the upper body 1 and the oil inlet space 43 of the pressure sensor 4.

It is possible to expect the embodiment to provide the following effects.

(1) After setting the pressure sensor 4 in the accommodation recessed portion 5, it is possible to, by only deforming the fixing portion 47 by the jig T, contact the fixing portion 47 and the stopper 52 with each other and prevent the pressure sensor 4 from falling out from the accommodation recessed portion 5. Compared to other fixing methods, such as screwing, this fixing operation for fixing the pressure sensor 4 is simple. Since the fixing members provided at the upper body 1 and the pressure sensor 4 are only the fixing portion 47 and the stopper 52, the structure of the upper body 1 and the structure of the pressure sensor 4 can be simplified.

(2) By providing the fixing portion 47 that is crimped at the pressure sensor 4 and the stepped stopper 52 at the upper body 1, valve body members need not be deformed when fixing the pressure sensor 4. Therefore, even if replacement of the pressure sensor 4 is required, the valve body need not be crimped, so that the valve body is not likely to be broken. By only replacing the lower case 41 of the pressure sensor 4, it is possible to fix a new pressure sensor 4 to the valve body.

(3) Compared to the case in which the valve body is provided with a screw or an attaching member having high strength, the amount of protrusion of the attaching member or the pressure sensor 4 that is fixed by the attaching member from a surface of the valve body is small, so that the valve body is made compact and light. The problems can be overcome without changing the material of the valve body from the currently used material having excellent market performance.

(4) By crimping, the fixing portion 47 that protrudes outward in a radial direction is provided at the periphery of the lower case 41 that has the pressure detection space 45 that extends to the pressure detection element. Therefore, the fixing portion 47 is superimposed upon the stopper 52 of the upper body 1 in a pressure receiving direction of oil pressure that is applied from the oil passage 3a. Therefore, even if the lower case 41 is subjected to high pressure, the lower case 41 and the valve body are not deformed.

(5) The fixing portion 47 is connected to the outer wall of the pressure sensor 4 at its second end in the axial direction, that is, at a lower portion of the groove 46; and protrudes outward in a radial direction and contacts the stopper 52 at its first end in the axial direction, that is, at its upper end. Therefore, by only inserting the jig T from thereabove, it is possible to easily deform the fixing portion 47.

(6) Since the stopper 52 is provided along the entire periphery of a wall at the accommodation recessed portion 5, positioning in a circumferential direction need not be performed, so that attaching workability is improved. When the fixing portion 47 is not ring-shaped, and a plurality of fixing portions 47 are provided at a fixed interval, for example, even if four fixing portions 47 are provided at an interval of 90 degrees, the positioning of the pressure sensor 4 in the circumferential direction is not required because the stopper 52 is provided along the entire periphery.

(7) When the fixing portion 47 is crimped, an end of the fixing portion 47 contacts the stopper 52 from therebelow so as to move to a location under the stopper 52 while moving along an arc-shaped path, so that the pressure sensor 4 is strongly pushed against the surface of the upper body 1. Therefore, pressure resistance when pressure is received is high. Since the pressure sensor 4 is subjected to stress produced by oil pressure in the direction of a base of the crimped fixing portion 47, even after the crimping, the main stress is not applied in a direction in which plastic change is reversed, so that the fixing portion 47 is unlikely to become dislodged from the stopper 52.

(8) Since the edges of the open portion of the groove 46 are chamfered, it is possible to easily insert the jig T into the groove 46 and to smoothly perform the crimping operation.

(9) Since a ring-shaped wall that protrudes towards the one end side in the axial direction of the pressure sensor 4 is formed at the surface of the upper body 1, and a portion surrounded by this ring-shaped wall is the accommodation recessed portion 5, the upper body 1 itself only needs to have a small wall thickness.

(10) The accommodation recessed portion 5 is provided in the upper surface of the upper body 1. Therefore, before superimposing the upper body 1 and the lower body upon each other, it is possible to previously fix the pressure sensor 4 to the upper body 1, and to easily attach the pressure sensor 4 to the valve body. On the other hand, it is possible to, after fixing the upper body and the lower body to each other to assemble the entire valve body and performing an oil pressure test or the like, attach the pressure sensor 4 to the valve body. Therefore, it is possible to attach as appropriate the pressure sensor 4 in accordance with the condition of the valve body, as a result of which the manufacturing process is a highly flexible process.

(11) The pressure sensor 4 includes the lower case 41 having the oil inlet space 43 that is connected to the oil passages of the valve body and the upper case 42 that is attached to the lower case and that accommodates the pressure detection element, and the fixing portion 47 is formed at the outer side of a side wall of the lower case 41 in the axial direction by crimping. Therefore, when the lower case 41 is made of a metal, the fixing portion 47 can be made strong, and the pressure detection element can be disposed in the upper case 42 where a force is not applied.

2. Second Embodiment

Figure 5:
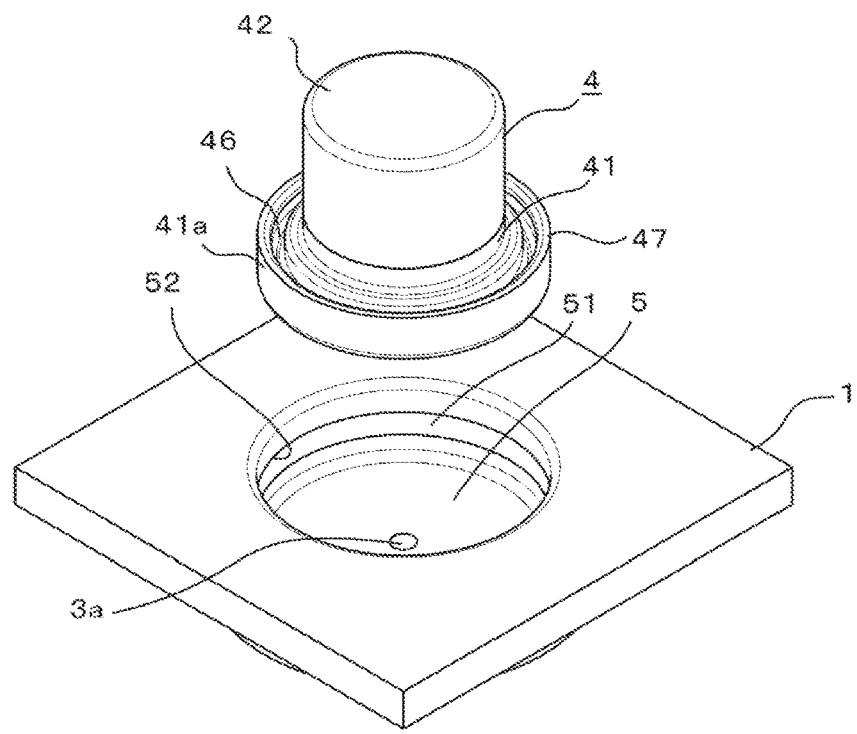
FIG. 5 is an exploded perspective view of a second embodiment.
Figure 6:
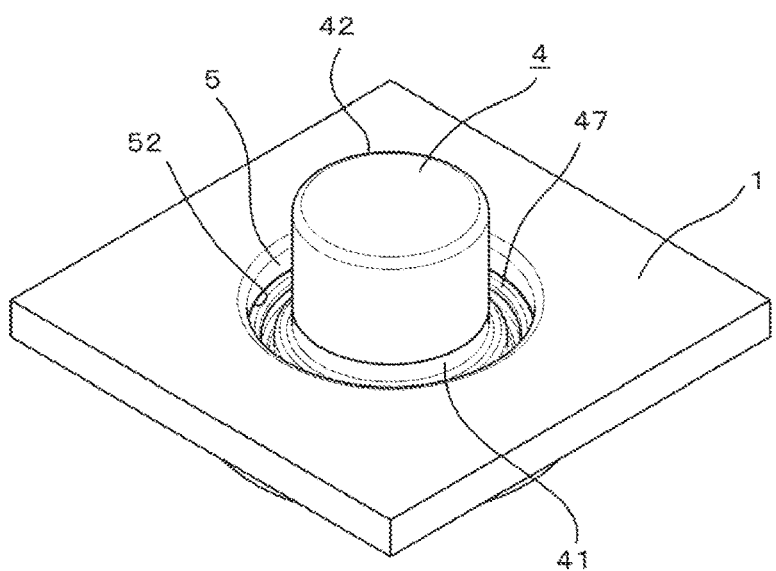
FIG. 6 is a perspective view illustrating an assembled state in the second embodiment.
Figure 7:
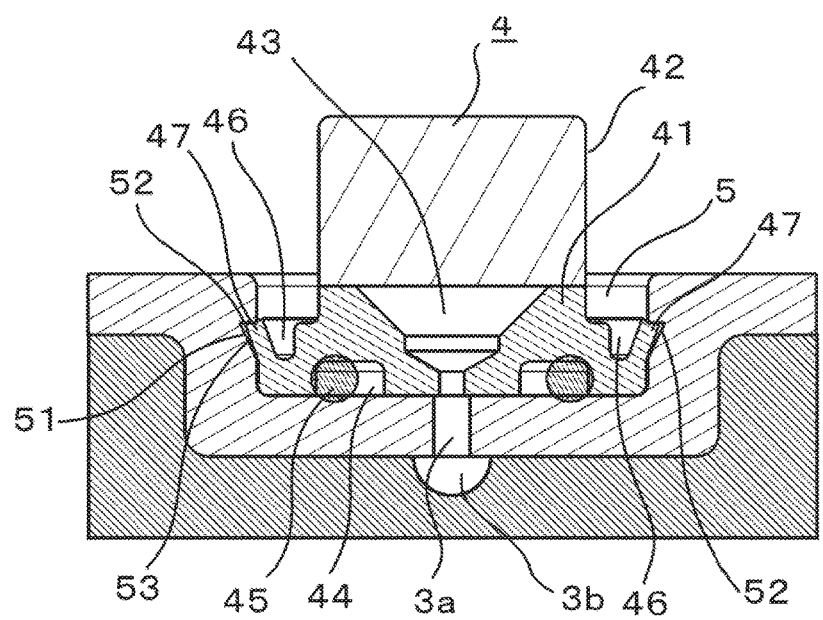
FIG. 7 is a vertical sectional view of the second embodiment.

A second embodiment according to the present invention is described with reference to FIGS. 5 to 7. Regarding the second embodiment, corresponding structural features to those according to the first embodiment are given the same reference numerals, and are not described below.

The second embodiment differs from the first embodiment in that an accommodation recessed portion 5 for accommodating a pressure sensor 4 is formed so as to be recessed downward from an upper surface of an upper body 1. In this case, the upper body 1 may be formed from a member having a wall thickness that is greater than the depth of the accommodation recessed portion 5, and the accommodation recessed portion 5 may be provided within this wall thickness. However, in the second embodiment, the upper body 1 is a thin body having a wall thickness that is smaller than the depth of the accommodation recessed portion 5, and the accommodation recessed portion 5 protrudes below a lower surface of the upper body 1. In accordance with this, a recessed portion to which a bottom portion of the accommodation recessed portion 5 is fitted is formed in the lower body 2.

Even in the second embodiment having such a structure, by crimping a fixing portion 47 that is provided at an outer periphery of the pressure sensor 4, the fixing portion 47 is brought into contact with a stopper 52 at the accommodation recessed portion 5, and the pressure sensor 4 is fixed in the accommodation recessed portion 5. As a result, the same operational effects as those exhibited by the first embodiment are exhibited. In particular, in the second embodiment, since the accommodation recessed portion 5 is recessed from a surface of the upper body 1, the amount of protrusion of the pressure sensor 4 fixed in the accommodation recessed portion 5 from the surface of the upper body 1 is small, so that it is possible to reduce the size of the valve body.

3. Other Embodiments

The present invention is not limited to the embodiments described above. The embodiments are examples and the present invention can be embodied in various other forms. Some elements may be omitted, replaced, or modified in various ways within the scope of the invention. The embodiments and modifications of the embodiments are included in the scope, gist, and equivalents of the invention. Examples of the modifications are as follows.

(1) A pressure sensor having a small height, that is, a so-called button-type pressure sensor may also be used as a columnar sensor having a central axis in the present invention. The pressure sensor is not limited to a columnar pressure sensor, and may be a polygonal columnar pressure sensor, in which case the shape of the inner wall of the accommodation recessed portion 5 is a polygonal shape in accordance with the shape of the pressure sensor.

(2) Although, in the illustrated embodiments, the accommodation recessed portion 5 is provided in the upper surface of the upper body 1, the accommodation recessed portion 5 need not be provided in the upper surface as long as the accommodation recessed portion 5 is provided in a surface of the valve body. The accommodation recessed portion 5 may be provided in a lower surface or a side surface of an integrated valve body, or a lower surface or a side surface of the lower body 2 when the valve body includes the upper body 1 and the lower body 2.

(3) The fixing portion 47 that is provided at the outer wall of the pressure sensor 4 need not be provided along the entire periphery of the pressure sensor 4. Protruding fixing portions 47 may be provided at equal intervals along the periphery of the pressure sensor 4. In this case, the groove 51 that is provided in the upper body 1 may be provided along the entire periphery of the inner wall of the accommodation recessed portion 5, or a plurality of grooves 51 may be provided at equal intervals in the inner wall of the accommodation recessed portion 5 so as to be aligned with the protruding fixing portions 47. The groove 51 that is provided in the upper body 1 is not limited to one having a triangular shape, and may be one that is, for example, rectangular in cross section.

(4) The structure of the pressure sensor 4 is not limited to those according to the illustrated embodiments. The position where the fixing portion 47 is provided only needs to be a position on the body of the pressure sensor 4. Therefore, unlike in the illustrated embodiments in which the fixing portion 47 is provided at the lower case 41, the fixing portion 47 may be provided at the upper case 42 or a supporting member.

(5) The material of the lower case 41 and the material of the upper case 42 are not limited to those in the illustrated embodiments. The upper case 42 may be made of, for example, a metal, and the lower case 41 may be made of a resin as long as the lower case 41 has sufficient strength.

The pressure sensor 4 need not include the lower case 41 and the upper case 42. The pressure sensor 4 may include one case.

(6) The flange portion 41a of the lower case 41 need not be formed along the entire periphery of the lower case 41. Protrusions may be provided on the periphery of the lower case 41 at equal intervals or appropriate intervals, and upper surfaces thereof may be formed as the flange 41a. It is possible to, without providing a flange portion, such as the illustrated flange portion 41a, provide a groove 46 in a wall surface of the lower case 41 or the upper case 42 so as to be open at its upper side in an oblique direction, and form an outer wall of the groove 46 as the fixing portion 47 that is crimped.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor attachment structure comprising:
    a valve body that has an oil passage therein, the valve body including an open end portion of the oil passage and an accommodation recessed portion in a surface of the valve body, the accommodation recessed portion being connected to the open end portion of the oil passage;
    a pressure sensor whose external shape is a columnar shape, the pressure sensor being connected to the oil passage with at least a portion of the pressure sensor being disposed in the accommodation recessed portion;
    a groove that is provided at an outer side of an outer wall of the pressure sensor in a radial direction, the groove being open at one end side in an axial direction of the pressure sensor;
    a horizontally extending stopper that has a form of a groove and that is provided at an inner wall of the sensor accommodation recessed portion; and
    a fixing portion that is provided on the outer side of the outer wall of the pressure sensor in the radial direction with respect to the groove, and that enters the stopper,
    wherein the fixing portion protrudes outward in the radial direction from the outer wall of the pressure sensor accommodated in the accommodation recessed portion and that contacts the stopper in the axial direction.

2. The sensor attachment structure according to claim 1, wherein the fixing portion is a crimped portion.

3. The sensor attachment structure according to claim 2, wherein the crimped portion is connected to the outer wall of the pressure sensor at a second end thereof in the axial direction, and protrudes outward in the radial direction and contacts the stopper at a first end thereof in the axial direction.

4. The sensor attachment structure according to claim 1, wherein the stopper is provided along an entire periphery of a wall at the accommodation recessed portion.

5. The sensor attachment structure according to claim 2, wherein an end portion of the crimped portion at the one end side in the axial direction has an arc shape.

6. The sensor attachment structure according to claim 5, wherein the stopper in the form of the groove has an inclined portion at an edge at the other end side in the axial direction, and
    wherein the crimped portion contacts the inclined portion.

7. The sensor attachment structure according to claim 1, wherein the surface of the valve body has a ring-shaped wall that protrudes towards the one end side in the axial direction of the pressure sensor, and
    wherein a portion that is surrounded by the ring-shaped wall is the accommodation recessed portion.

8. The sensor attachment structure according to claim 1, wherein the surface of the valve body has a recessed portion whose bottom surface is recessed towards the other end side in the axial direction of the pressure sensor with respect to the surface of the valve body, and
    wherein the recessed portion is the accommodation recessed portion.

9. The sensor attachment structure according to claim 1, wherein the valve body includes
    an upper body that includes the accommodation recessed portion and the oil passage,
    a lower body that is directly superimposed upon the upper body or that is superimposed upon the upper body with a separate plate in between, and
    an oil passage that is provided in the lower body and that is connected to the oil passage of the upper body, and
    wherein the accommodation recessed portion is provided in an upper surface of the upper body.

10. The sensor attachment structure according to claim 2, wherein the sensor includes
    a lower case that has an oil inlet space that is connected to the oil passage of the valve body, and
    an upper case that is attached to the lower case and that accommodates a pressure detection element, and
    wherein the lower case protrudes in a form of a flange outward in the radial direction with respect to the upper case, and includes the crimped portion at an outer side of a side wall of the lower case in the axial direction.

* * * * *